(12) United States Patent  
Hu

(10) Patent No.: US 11,063,095 B2  
(45) Date of Patent: Jul. 13, 2021

(54) ARRAY SUBSTRATE, DISPLAY PANEL HAVING THE SAME, AND METHOD OF FABRICATING ARRAY SUBSTRATE

(71) Applicant: BOE TECHNOLOGY GROUP CO., LTD., Beijing (CN)

(72) Inventor: Chunjing Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 439 days.

(21) Appl. No.: 15/780,767

(22) PCT Filed: Jun. 1, 2017

(86) PCT No.: PCT/CN2017/086844  
§ 371 (c)(1),  
(2) Date: Jun. 1, 2018

(87) PCT Pub. No.: WO2018/218608  
PCT Pub. Date: Dec. 6, 2018

(65) Prior Publication Data  
US 2020/0251540 A1    Aug. 6, 2020

(51) Int. Cl.  
*H01L 29/08* (2006.01)  
*H01L 35/24* (2006.01)  
(Continued)

(52) U.S. Cl.  
CPC ...... *H01L 27/3246* (2013.01); *H01L 27/3276* (2013.01); *H01L 51/56* (2013.01); *H01L 2227/323* (2013.01)

(58) Field of Classification Search  
CPC ..... H01L 27/124; H01L 27/3211–3218; H01L 27/3246; H01L 27/3248; H01L 27/3274;  
(Continued)

(56) References Cited

U.S. PATENT DOCUMENTS

2001/0011868 A1   8/2001   Fukunaga et al.  
2007/0035239 A1   2/2007   Kang et al.  
(Continued)

FOREIGN PATENT DOCUMENTS

CN   101330004 A   12/2008  
CN   101640215 A    2/2010  
(Continued)

OTHER PUBLICATIONS

International Search Report & Written Opinion dated Feb. 24, 2018, regarding PCT/CN2017/086844.  
(Continued)

*Primary Examiner* — Calvin Y Choi  
(74) *Attorney, Agent, or Firm* — Intellectual Valley Law, P.C.

(57) ABSTRACT

The present application discloses an array substrate having a subpixel region and an inter-subpixel region. The array substrate includes a base substrate; a thin film transistor on the base substrate and including a drain electrode; a passivation layer on a side of the thin film transistor distal to the base substrate; a pixel electrode layer on a side of the passivation layer distal to the base substrate; a pixel definition layer in the inter-subpixel region; and an organic light emitting layer in the subpixel region on a side of the pixel electrode layer distal to the passivation layer. The array substrate includes a via extending through the passivation layer. The pixel electrode layer is electrically connected to the drain electrode of the thin film transistor through the via. The via is in the subpixel region.

20 Claims, 5 Drawing Sheets

(51) Int. Cl.
  *H01L 51/00* (2006.01)
  *H01L 27/32* (2006.01)
  *H01L 51/56* (2006.01)
(58) Field of Classification Search
  CPC ............. H01L 27/3276; H01L 27/3283; H01L 27/3295; H01L 51/56; H01L 51/5206–5218; H01L 2227/323; G09G 2300/0478–0495; G09G 2300/0443–0447
  USPC .......................................................... 257/40
  See application file for complete search history.

(56) References Cited

U.S. PATENT DOCUMENTS

| | | |
|---|---|---|
| 2008/0315207 A1 | 12/2008 | Yang et al. |
| 2009/0315034 A1 | 12/2009 | Lee et al. |
| 2010/0026170 A1 | 2/2010 | Kim et al. |
| 2010/0044691 A1 | 2/2010 | Hong et al. |
| 2010/0200869 A1 | 8/2010 | Sekiya |
| 2012/0001184 A1 | 1/2012 | Ha et al. |
| 2012/0193656 A1 | 8/2012 | Tseng et al. |
| 2013/0330868 A1 | 12/2013 | Suh |
| 2014/0159043 A1* | 6/2014 | Sakariya ............. H01L 25/0753 257/59 |
| 2015/0053955 A1 | 2/2015 | Furuie et al. |
| 2015/0194618 A1* | 7/2015 | Cheng ................. H01L 51/5253 257/40 |
| 2016/0358988 A1* | 12/2016 | Matsubara ........ H01L 29/78633 |
| 2017/0010734 A1* | 1/2017 | Liu ....................... H01L 27/323 |
| 2017/0018602 A1 | 1/2017 | Yun et al. |

FOREIGN PATENT DOCUMENTS

| | | |
|---|---|---|
| CN | 101645455 A | 2/2010 |
| CN | 101656265 A | 2/2010 |
| JP | 2005266616 A | 9/2005 |
| JP | 2009301058 A | 12/2009 |
| JP | 2012015092 A | 1/2012 |
| JP | 2012124103 A | 6/2012 |
| JP | 2014159089 A | 9/2014 |

OTHER PUBLICATIONS

The Extended European Search Report in the European Patent Application No. 17877383.4, dated Dec. 9, 2020.
First Office Action in the Japanese Patent Application No. 2018528771, dated Mar. 8, 2021; English translation attached.

* cited by examiner

ARRAY SUBSTRATE, DISPLAY PANEL HAVING THE SAME, AND METHOD OF FABRICATING ARRAY SUBSTRATE

CROSS-REFERENCE TO RELATED APPLICATION

This application is a national stage application under 35 U.S.C. § 371 of International Application No. PCT/CN2017/086844, filed Jun. 1, 2017, the contents of which are incorporated by reference in the entirety.

TECHNICAL FIELD

The present invention relates to display technology, more particularly, to an array substrate, a display panel having the same, and a method of fabricating an array substrate.

BACKGROUND

Organic light emitting diode (OLED) display apparatuses are self-emissive devices, and do not require backlights. OLED display apparatuses provide more vivid colors and a larger color gamut as compared to the conventional liquid crystal display (LCD) apparatuses. Further, OLED display apparatuses can be made more flexible, thinner, and lighter than a typical LCD apparatus.

An OLED display apparatus typically includes an anode, an organic layer including a light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. The cathode is optically transparent, while the anode is reflective.

SUMMARY

In one aspect, the present invention provides an array substrate having a subpixel region and an inter-subpixel region, comprising a base substrate; a thin film transistor on the base substrate and comprising a drain electrode; a passivation layer on a side of tire thin film transistor distal to the base substrate; a pixel electrode layer on a side of the passivation layer distal to the base substrate; a pixel definition layer in live inter-subpixel region on a side of the pixel electrode layer distal to the passivation layer and defining the subpixel region; and an organic light emitting layer in the subpixel region on a side of the pixel electrode layer distal to the passivation layer; wherein the array substrate comprises a via extending through the passivation layer; the pixel electrode layer is electrically connected to the chain electrode of the thin film transistor through the via; and the via is in the subpixel region.

Optionally, a projection of the via on the base substrate is substantially non-overlapping with that of any pixel definition layer in the array substrate.

Optionally, a projection of the organic light emitting layer on the base substrate substantially covers that of the via.

Optionally, a projection of a light emitting region of the organic light emitting layer on the base substrate substantially covers that of the via.

Optionally, the drain electrode of the thin film transistor is in the subpixel region.

Optionally, a projection of the drain electrode on the base substrate is substantially non-overlapping with that of any pixel definition layer in the array substrate.

Optionally, a projection of the organic light emitting layer on the base substrate substantially covers that of the drain electrode.

Optionally, a projection of a light emitting region of the organic light emitting layer on the base substrate substantially covers that of the chain electrode.

Optionally, a projection of a light emitting region of the organic light emitting layer on the base substrate substantially covers that of the thin film transistor.

Optionally, the array substrate comprises a plurality of subpixel areas each of which having a shape elongated along a first direction; wherein a width of the subpixel region in each of the plurality of subpixel areas along the first direction is greater than a pitch of the plurality of subpixel areas along the first direction minus 30 μm.

Optionally, the width of the subpixel region in each of the plurality of subpixel areas along the first direction is approximately the pitch minus 17 μm.

Optionally, the array substrate comprises a plurality of subpixel areas each of which having a shape elongated along a first direction; wherein a width of the pixel definition layer between adjacent two subpixel regions respectively in adjacent two subpixel areas along the first direction is smaller than 30 μm.

Optionally, the width of the pixel definition layer between adjacent two subpixel regions respectively in adjacent two subpixel areas along the first direction is approximately 17 μm.

Optionally, the array substrate comprises a plurality of subpixel areas each of which having a shape elongated along a first direction; wherein the plurality of subpixel areas have a pitch along the first direction; and a width of the organic light emitting layer in each of the plurality of subpixel areas along the first direction is greater than the pitch minus 30 μm.

Optionally, the width of the organic light emitting layer in each of the plurality of subpixel areas along the first direction is approximately the pitch minus 17 μm.

Optionally, a first portion of the pixel electrode layer corresponding to the via has a first surface distal to the base substrate; and the first surface is substantially level with a surface of other portions of the pixel electrode layer distal to the base substrate.

Optionally, the array substrate comprises a solidified silver paste in the via.

Optionally, a first portion of the pixel electrode layer corresponding to the via has a first surface distal to the base substrate; and the first surface is concave relative to a surface of other portions of the pixel electrode layer distal to the base substrate.

In one aspect, the present invention provides a display panel comprising an array substrate described herein.

In one aspect, the present invention provides a method of fabricating an array substrate, comprising forming a thin film transistor on a base substrate, the thin film transistor being formed to comprises a drain electrode; forming a passivation layer on a side of the thin film transistor distal to the base substrate; forming a pixel electrode layer on a side of the passivation layer distal to the base substrate; forming a pixel definition layer on a side of the pixel electrode layer distal to the passivation layer and defining the subpixel region; forming an organic light emitting layer on a side of the pixel electrode layer distal to the passivation layer; and forming a via extending through the passivation layer, the pixel electrode layer being formed to be electrically connected to the drain electrode of the thin film transistor through the via; wherein the pixel definition layer defines a subpixel region of the array substrate; the organic light emitting layer is formed in the subpixel region; and the via is formed in the subpixel region.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
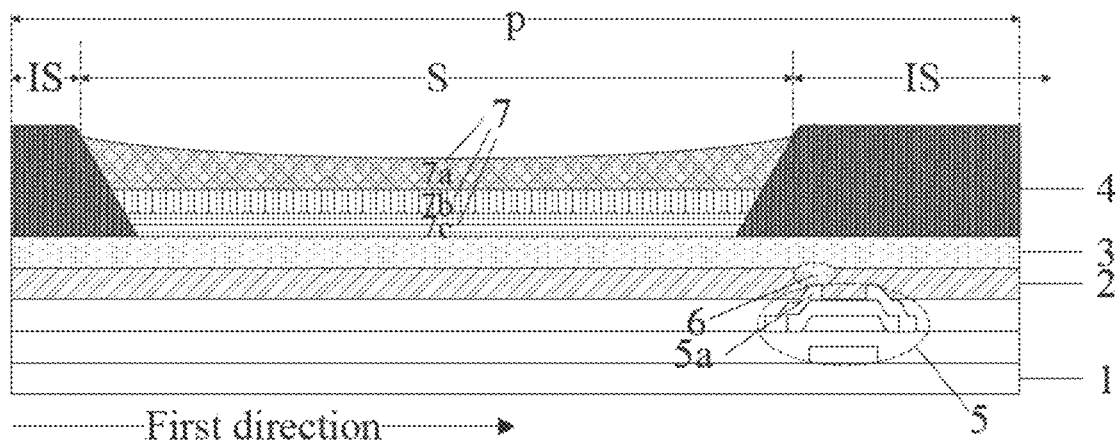
FIG. 1 is a cross-sectional view of a conventional array substrate.
Figure 2:
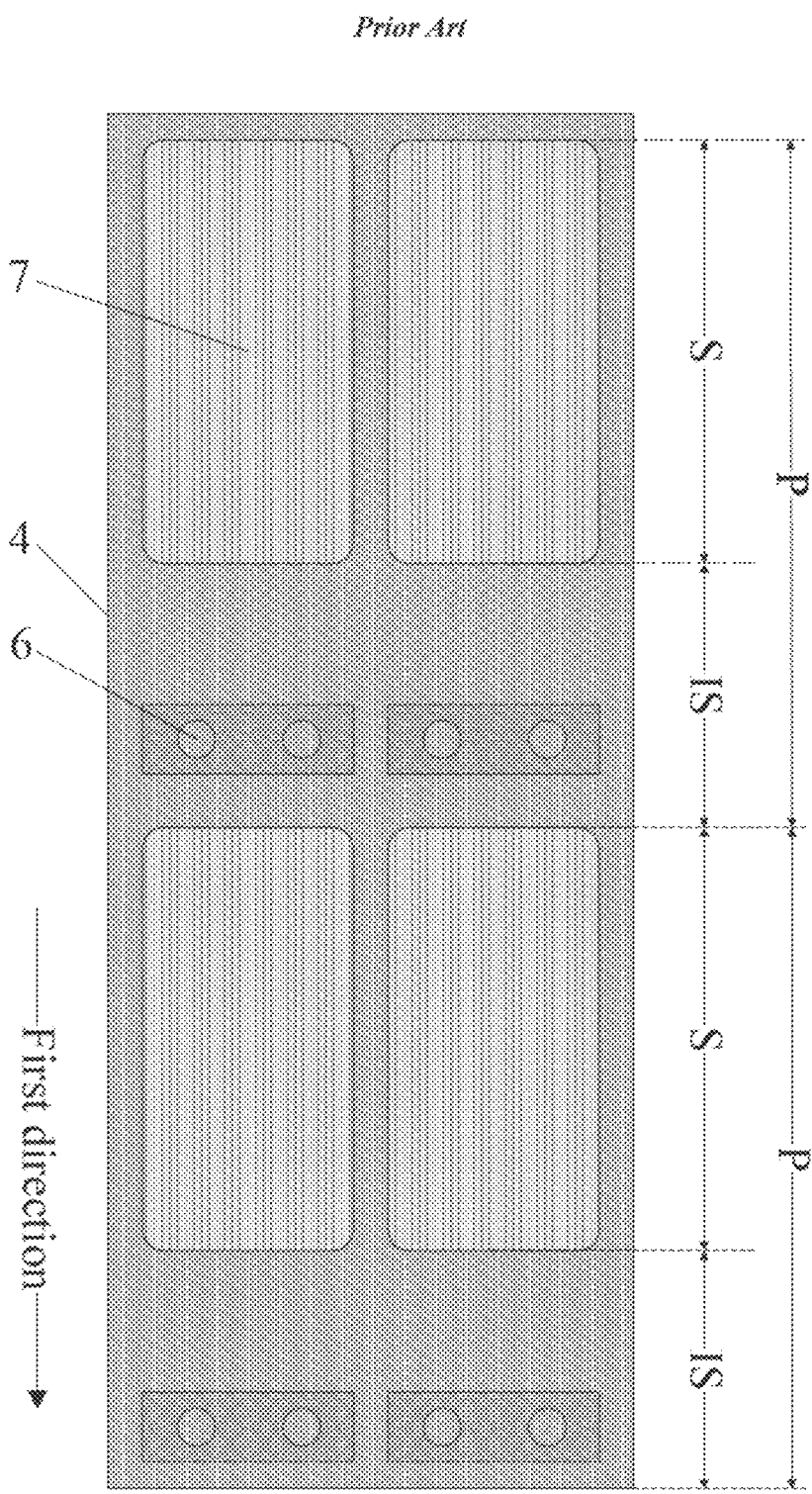
FIG. 2 is a plan view of a conventional array substrate.

FIG. 1 is a cross-sectional view of a conventional array substrate. FIG. 2 is a plan view of a conventional array substrate. Referring to FIG. 1 and FIG. 2, the conventional array substrate in some embodiments includes a subpixel region S and an inter-subpixel region IS. The conventional array substrate includes a base substrate 1, a thin film transistor 5 having a drain electrode 5a on the base substrate 1, a passivation layer 2 on a side of the thin film transistor 5 distal to the base substrate 1, a pixel electrode layer 3 on a side of the passivation layer 2 distal to the base substrate 1, a pixel definition layer 4 in the inter-subpixel region IS on a side of the pixel electrode layer 3 distal to the passivation layer 2 and defining the subpixel region S, and an organic layer 7 in the subpixel region S on a side of the pixel electrode layer 3 distal to the passivation layer 2. The conventional array substrate includes a via 6 extending through the passivation layer 2. The pixel electrode layer 3 is electrically connected to the drain electrode 5a of the thin film transistor 5 through the via 6. In the conventional array substrate, the thin film transistor 5 is entirely covered by the pixel definition layer 4. For example, the via 6 is in the inter-subpixel region IS. The aperture ratio of the convention array substrate is relatively small.

In the conventional array substrate, the pixel definition layer 4 generally has an isosceles trapezoidal shape, and is made of a hydrophobic material having a small surface energy to ensure that the ink droplets spread in subpixel areas without overflowing to the pixel definition layer 4 outside the subpixel areas. During the ink-jet printing process, a solvent in the ink droplets close to an edge of the pixel definition layer 4 volatilizes quickly due to a slope angle of the pixel definition layer 4 and a surface energy difference between the ink droplets and the pixel definition layer 4 when they are in contact with each other. After being finally dried, the ink droplets produce an uneven thin film winch is relatively thicker at an edge portion and is relatively thinner at the middle portion, a.k.a., "coffee ring effect". Due to this coffee ring effect, the organic layer 7 has a non-uniform thickness. An organic layer 7 having the non-uniform thickness results in an unevenly distributed light emission. Display quality of a display panel having the conventional array substrate is compromised.

Accordingly, the present disclosure provides, inter alia, an array substrate, a display panel having the same, and a method of fabricating an array substrate that substantially obviate one or more of the problems due to limitations and disadvantages of the related art. In one aspect, the present disclosure provides an array substrate having a subpixel region and an inter-subpixel region. In some embodiments, the array substrate includes a base substrate; a thin film transistor on the base substrate and having a drain electrode, a passivation layer on a side of the thin film transistor distal to the base substrate; a pixel electrode layer on a side of the passivation layer distal to the base substrate; a pixel definition layer in the inter-subpixel region on a side of the pixel electrode layer distal to the passivation layer and defining the subpixel region; and an organic light emitting layer in the subpixel region on a side of the pixel electrode layer distal to the passivation layer. The array substrate includes a via extending through the passivation layer. The pixel electrode layer is electrically connected to the drain electrode of the thin film transistor through the via. The via is in the subpixel region.

As used herein, the term "subpixel region" refers to a light emission region of a subpixel, such as a region corresponding to a light emitting layer in an organic light emitting diode display panel or an organic light emitting diode array substrate. Optionally, a light emitting layer in an organic light emitting diode display panel or an organic light emitting diode array substrate includes a light emitting portion and a non-emitting portion, in the context of the present disclosure, the subpixel region refers to a region corresponding to the light emitting portion of the light emitting layer of the organic light emitting diode display panel or the organic light emitting diode array substrate. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, the term "inter-subpixel region" refers to a region between adjacent subpixel regions, such as a region corresponding a pixel definition layer in an organic light emitting diode display panel or an organic light emitting diode array substrate. Optionally, a light emitting layer in an organic light emitting diode display panel or an organic light emitting diode array substrate includes a light emitting portion and a non-emitting portion, in the context of the present disclosure, the inter-subpixel region includes a region corresponding to the non-emitting portion of the light emitting layer of the organic light emitting diode display panel or the organic light emitting diode array substrate. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region of a region between a subpixel region of a green color subpixel and a subpixel region of an adjacent blue color subpixel.

As used herein, the term "subpixel area" refers to an area in an array substrate corresponding to a subpixel in a display panel having the array substrate. A subpixel area includes a subpixel region and an inter-subpixel region.

Figure 3:
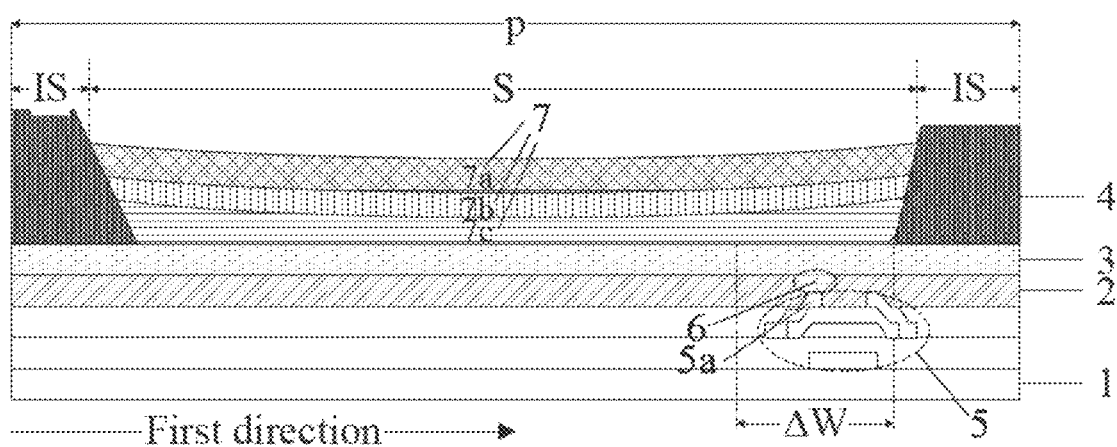
FIG. 3 is a cross-sectional view of an array substrate in some embodiments according to the present disclosure.
Figure 4:
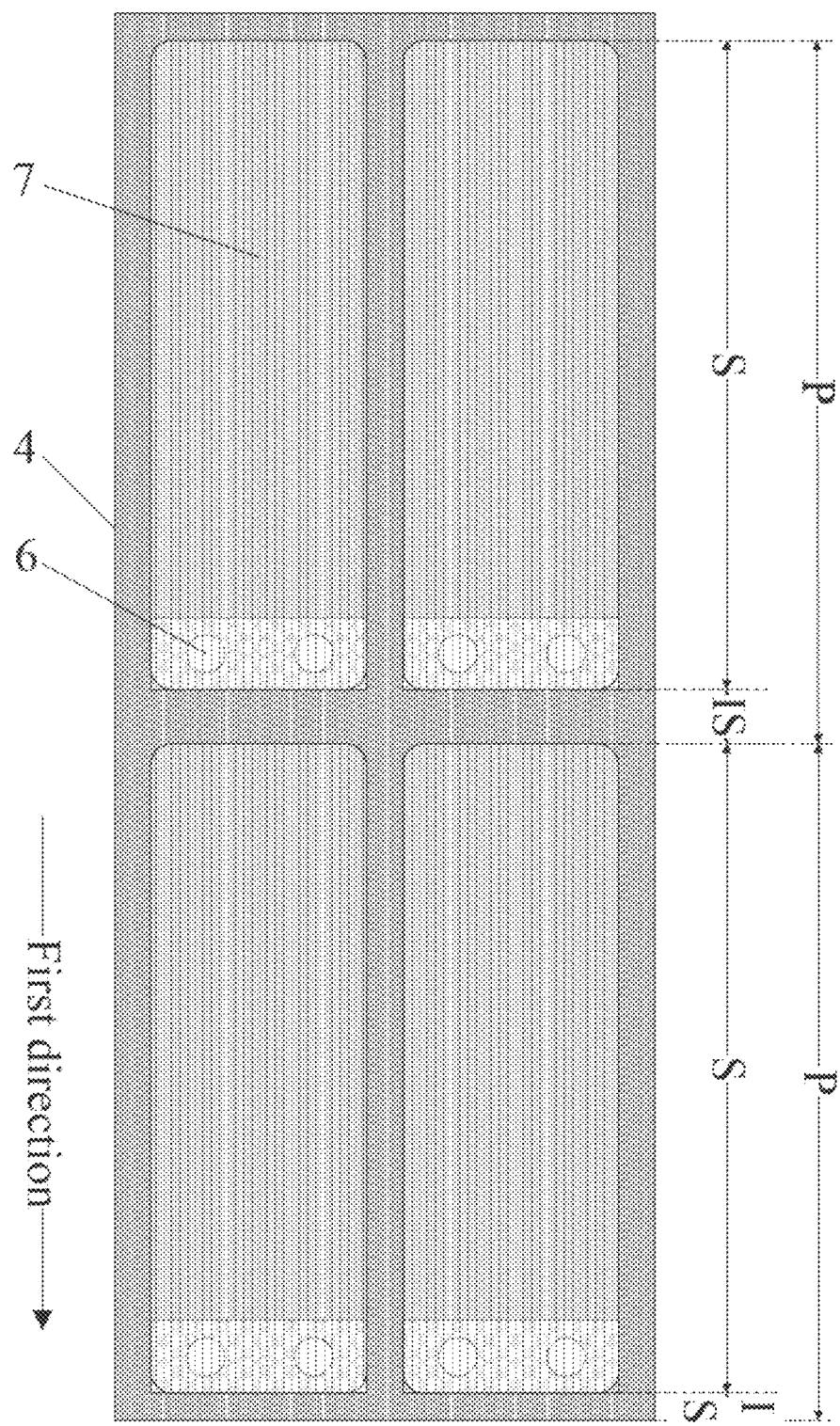
FIG. 4 is a plan view of an array substrate in some embodiments according to the present disclosure.

FIG. 3 is a cross-sectional view of an array substrate in some embodiments according to the present disclosure. FIG. 4 is a plan view of an array substrate in some embodiments according to the present disclosure. Referring to FIG. 3 and FIG. 4, the array substrate in some embodiments includes a subpixel region S and an inter-subpixel region IS. The array substrate includes an array of a plurality of subpixel areas. FIG. 3 shows one subpixel area of the array substrate. The array substrate includes a base substrate 1, a thin film transistor 5 having a drain electrode 5a on the base substrate 1, a passivation layer 2 on a side of the thin film transistor 5 distal to the base substrate 1, a pixel electrode layer 3 on a side of the passivation layer 2 distal to the base substrate 1, a pixel definition layer 4 in the inter-subpixel region IS on a side of the pixel electrode layer 3 distal to the passivation layer 2 and defining the subpixel region S, and au organic layer 7 in the subpixel region S on a side of the pixel electrode layer 3 distal to the passivation layer 2. The array substrate includes a via 6 extending through the passivation layer 2. The pixel electrode layer 3 is electrically connected to the drain electrode 5a of the thin film transistor 5 through the via 6. As shown in FIG. 3 and FIG. 4, the via 6 is in the subpixel region S. The organic layer 7 includes an organic light emitting layer 7b. Optionally, the organic layer 7 further includes one or more organic functional layers.

In some embodiments, the organic layer 7 further includes one or more organic functional layers between the organic light emitting layer 7b and the pixel electrode layer 3 in the subpixel region. Optionally, the one or more organic functional layer includes a carrier transport layer such as a hole transport layer. Optionally, the one or more organic functional layer includes a carrier injection layer such as a hole injection layer. Optionally, the organic layer 7 includes a hole injection layer on a side of the pixel electrode layer 3 distal to the base substrate 1, a hole transport layer on a side of the hole injection layer distal to the pixel electrode layer 3, and an organic light emitting layer 7b on a side of the hole transport layer distal to the hole injection layer. Referring to FIG. 3, the or game layer 7 includes a hole transport layer 7c on a side of the pixel electrode layer 3 distal to the base substrate 1, and an organic light emitting layer 7b on a side of the hole transport layer 7c distal to base substrate 1.

In some embodiments, the organic layer 7 further includes one or more organic functional layers on a side of the organic light emitting layer 7b distal to the base substrate 1. Optionally, the one or more organic functional layer includes a carrier transport layer such as an electron transport layer. Optionally, the one or more organic functional layer includes a carrier injection layer such as an election injection layer. Optionally, the organic layer 7 includes an election transport layer 7a on a side of the organic light emitting Layer 7b distal to the pixel electrode layer 3, and an electron injection layer on a side of the election transport layer 7a distal to the organic light emitting layer 7b. Referring to FIG. 3, the organic layer 7 includes a hole transport layer 7c on a side of the pixel electrode layer 3 distal to the base substrate 1, an organic light emitting layer 7b on a side of the hole transport layer 7c distal to base substrate 1, and an election transport layer 7a on a side of the organic light emitting layer 7b distal to the hole transport layer 7c.

Optionally, the organic layer 7 includes a hole injection layer on a side of the pixel electrode layer 3 distal to the base substrate 1, a hole transport layer 7c on a side of the hole injection layer distal to the pixel electrode layer 3, an organic light emitting layer 7b on a side of the hole transport layer 7c distal to the hole injection layer, an electron transport layer 7a on a side of the organic light emitting layer 7b distal to the hole transport layer 7c, and an electron injection layer on a side of the election transport layer 7a distal to the organic light emitting layer 7b.

Optionally, the pixel electrode layer 3 is a cathode. Optionally, the pixel electrode layer 3 is an anode. Optionally, the array substrate is an organic light emitting diode array substrate. Optionally, the array substrate is an active matrix organic light emitting diode array substrate. Optionally, the array substrate is a passive matrix organic light emitting diode array substrate. Optionally, the thin film transistor 5 is a driving thin film transistor for driving light emission of the organic light emitting layer 7 in the array substrate.

By having this design, an array substrate having a dramatically increased aperture ratio and an organic layer 7 (e.g., an organic light emitting layer 7b) of a substantially uniform thickness can be achieved. As compared to the conventional array substrate (e.g., the array substrate in FIG. 1 and FIG. 2), the present array substrate has a subpixel region S with an increased width, e.g., along the first direction. Similarly, the organic layer 7 (e.g., the organic light emitting layer 7b) in the present array substrate also has an increased width, e.g., along the first direction. As denoted in FIG. 3, the width of the organic layer 7 (e.g., the organic light emitting layer 7b) along the first direction increases by a value of $\Delta W$ as compared to that in FIG. 1. The organic layer 7 (e.g., the organic light emitting layer 7b) typically has a substantially uniform thickness in a middle portion of the organic layer 7 (e.g., the organic light emitting layer 7b) and has a greater thickness only in an edge portion of the organic layer 7 (e.g., the organic light emitting layer 7b). By increasing the width of the organic layer 7 (e.g., the organic light emitting layer 7b), an area and a width of the middle portion also increase, thereby achieving a substantially more uniform overall thickness and a substantially more evenly distributed light emission from the organic layer 7. As further detailed in the embodiments below, the aperture ratio of the present array substrate increases by at least 9% as compared to the conventional array substrate.

The width of the pixel definition layer 4 along the first direction decreases by the value of $\Delta W$ as compared to that in FIG. 1. By having a pixel definition layer 4 with a decreased width (e.g., along the first direction), the via 6 is no longer covered by the pixel definition layer 4. In some embodiments, a projection of the via 6 on the base substrate 1 is substantially non-overlapping with that of any pixel definition layer in the array substrate. For example, and as shown in FIG. 3 and FIG. 4, the projection of the via 6 on the base substrate 1 is substantially non-overlapping with that of the pixel definition layer 4. Optionally, the array substrate may include additional pixel definition layers, and the projection of the via 6 on the base substrate 1 is substantially non-overlapping with those of the additional pixel definition layers.

In some embodiments, a projection of the organic layer 7 (e.g., the organic light emitting layer 7b) on the base substrate 1 substantially overlaps with that of the via 6. Optionally, a projection of the organic layer 7 (e.g., the organic light emitting layer 7b) on the base substrate 1 substantially covers that of the via 6. In one example, in forming the organic layer 7 (e.g., the organic light emitting layer 7b), some organic light emitting material may be disposed on the pixel definition layer 4. The organic light emitting material on top of the pixel definition layer 4 are not capable of emitting light. Accordingly, in some embodiments, a projection of a light emitting region of the organic layer 7 (e.g., a light emitting region of the organic light emitting layer 7b) on the base substrate 1 substantially overlaps with that of the via 6. Optionally, a projection of a light emitting region of the organic layer 7 (e.g., a light emitting region of the organic light emitting layer 7b) on the base substrate 1 substantially covers that of the via 6.

In some embodiments, at least a portion of the thin film transistor 5 is in the subpixel region S. In one example, the drain electrode 5a of the thin film transistor 5 is in the subpixel region S. In some embodiments, a projection of the drain electrode 5a on the base substrate 1 is substantially non-overlapping will that of any pixel definition layer in the array substrate. For example, and as shown in FIG. 3 and FIG. 4, the projection of the drain electrode 5a on the base substrate 1 is substantially non-overlapping with that of the pixel definition layer 4. Optionally, the array substrate may include additional pixel definition layers, and the projection of the chain electrode 5a on the base substrate 1 is substantially non-overlapping with those of the additional pixel definition layers.

In some embodiments, a projection of the organic layer 7 (e.g., the organic light emitting layer 7b) on the base substrate 1 substantially overlaps with that of the drain electrode 5a. Optionally, a projection of the organic layer 7 (e.g., the organic light emitting layer 7b) on the base substrate 1 substantially covers that of the drain electrode 5a. In some embodiments, a projection of a light emitting region of the organic layer 7 (e.g., a light emitting region of the organic light emitting layer 7b) on the base substrate 1 substantially overlaps with that of the drain electrode 5a. Optionally, a projection of a light emitting region of the organic layer 7 (e.g., a light emitting region of the organic light emitting layer 7b) on the base substrate 1 substantially covers that of the drain electrode 5a.

In some embodiments, the thin film transistor 5 is entirely in the subpixel region S. In some embodiments, a projection of the thin film transistor 5 on the base substrate 1 is substantially non-overlapping with that of any pixel definition layer in the array substrate. Optionally, the projection of the thin film transistor 5 on the base substrate 1 is substantially non-overlapping with that of the pixel definition layer 4. Optionally, the array substrate may include additional pixel definition layers, and the projection of the thin film transistor 5 on the base substrate 1 is substantially non-overlapping with those of the additional pixel definition layers.

In some embodiments, a projection of the organic layer 7 (e.g., the organic light emitting layer 7b) on the base substrate 1 substantially overlaps with that of the thin film transistor 5. Optionally, a projection of the organic layer 7 (e.g., the organic light emitting layer 7b) on the base substrate 1 substantially covers that of the thin film transistor 5. In some embodiments, a projection of a light emitting region of the organic layer 7 (e.g., a light emitting region of the organic light emitting layer 7b) on the base substrate 1 substantially overlaps with that of the thin film transistor 5. Optionally, a projection of a light emitting region of the organic layer 7 (e.g., a light emitting region of the organic light emitting layer 7b) on the base substrate 1 substantially covers that of the thin film transistor 5.

In some embodiments, and referring to FIG. 4, the array substrate includes a plurality of subpixel areas each of which has a shape elongated along the first direction. The plurality of subpixel areas have a pitch p along the first direction. In some embodiments, a width of the subpixel region S in each of the plurality of subpixel areas along the first direction is equal to (p−q); wherein p is the pitch of the plurality of subpixel areas along the first direction, and q is a value equal to or less than 35 μm. Optionally, q=35 μm. Optionally, q=30 μm. Optionally, q=25 μm. Optionally, q=20 μm. Optionally, the width of the subpixel region S in each of the plurality of subpixel areas along the first direction is approximately (p−17 μm).

In one example, the array substrate is a 160 pixel-per-inch (ppi) array substrate. The plurality of subpixel areas in the 160-ppi array substrate have a pitch p1 of 158.7 μm along the first direction (e.g., the longitudinal direction of the subpixel area), and a pitch p2 of 52.9 μm along a second direction (e.g., the lateral direction of the subpixel area). In another example, the width of the subpixel region S in each of the plurality of subpixel areas in the 160-ppi array substrate along the first direction is approximately (p1−17 μm)=(158.7 μm−17 μm)=141.7 μm. The width of the subpixel region S in each of the plurality of subpixel areas in the 160-ppi array substrate along the second direction is approximately (p2−17 μm)=(52.9 μm−17 μm)=35.9 μm. The size of the via 6 is typically 14 μm×26 μm. Thus, the aperture ratio in the example is approximately (141.7×35.9−14×26)/(158.7×52.9), i.e., approximately 56.3%.

In the conventional 160-ppi array substrate, the width of the subpixel region S in each of the plurality of subpixel areas in the 160-ppi conventional array substrate along the first direction is approximately (p1−40.9 μm)=(158.7 μm−40.9 μm)=117.8 μm. The width of the subpixel region S m each of the plurality of subpixel areas in the 160-ppi conventional array substrate along the second direction is approximately (p2−17 μm)=(52.9 μm−17 μm)−35.9 μm. The aperture ratio in the conventional array substrate is approximately (117.8×35.9)/(158.7×52.9), i.e., approximately 47.1%. Thus, the aperture ratio of the present array substrate increases by 9.2% as compared to the conventional array substrate.

In some embodiments, the present array substrate includes a plurality of subpixel areas each of which having a shape elongated along the first direction. Optionally, a width of the pixel definition layer between adjacent two subpixel regions S respectively in adjacent two subpixel areas along the first direction is smaller than q, wherein q is a value equal to or less than 35 μm. Optionally, q=35 μm. Optionally, q=30 μm. Optionally, q=25 μm. Optionally, q=20 μm. In one example, the width of the pixel definition layer between adjacent two subpixel regions S respectively in adjacent two subpixel areas along the first direction is approximately 17 μm.

In some embodiments, the present array substrate includes a plurality of subpixel areas each of which having a shape elongated along the first direction. The plurality of subpixel areas have a pitch along the first direction. In some embodiments, a width of the organic layer 7 (e.g., the organic light emitting layer 7b) in each of the plurality of subpixel areas along the first direction is equal to (p−q): wherein p is the pitch of the plurality of subpixel areas along the first direction, and q is a value equal to or less than 35 μm. Optionally, q=35 μm. Optionally, q=30 μm Optionally, q=25 μm. Optionally, q=20 μm. Optionally, the width of the organic layer 7 (e.g., the organic light emitting layer 7b) in each of the plurality of subpixel areas along the first direction is approximately (p–17 μm).

In some embodiments, a width of a light emitting region of the organic layer 7 (e.g., the organic light emitting layer 7b) in each of the plurality of subpixel areas along the first direction is equal to (p–q); wherein p is the pitch of the plurality of subpixel areas along the first direction, and q is a value equal to or less than 35 μm. Optionally, q=35 μm Optionally, q=30 μm. Optionally, q=25 μm. Optionally, q=20 μm. Optionally, the width of the light emitting region of the organic layer 7 (e.g., the organic light emitting layer 7b) in each of the plurality of subpixel areas along the first direction is approximately (p–17 μm).

In some embodiments, and referring to FIG. 3, a portion of the pixel electrode layer 3 corresponding to the via 6 has a surface distal to the base substrate 1, and the surface of the portion corresponding to the via 6 is substantially level with a surface of other portions of the pixel electrode layer 3 distal to the base substrate 1. Various appropriate methods may be used to make a substantially level surface. In one example, a conductive paste (e.g., a silver paste) can be printed (e.g., by ink-jet printing) in the via 6. The conductive paste is then solidified. Subsequently, the pixel electrode layer 3 is formed on the passivation layer 2 with the via 6 pre-filled with the solidified conductive paste. By having the via 6 pre-filled with the conductive paste, the entire surface of the pixel electrode layer 3 distal to the passivation layer 2 can be made substantially level.

Figure 5:
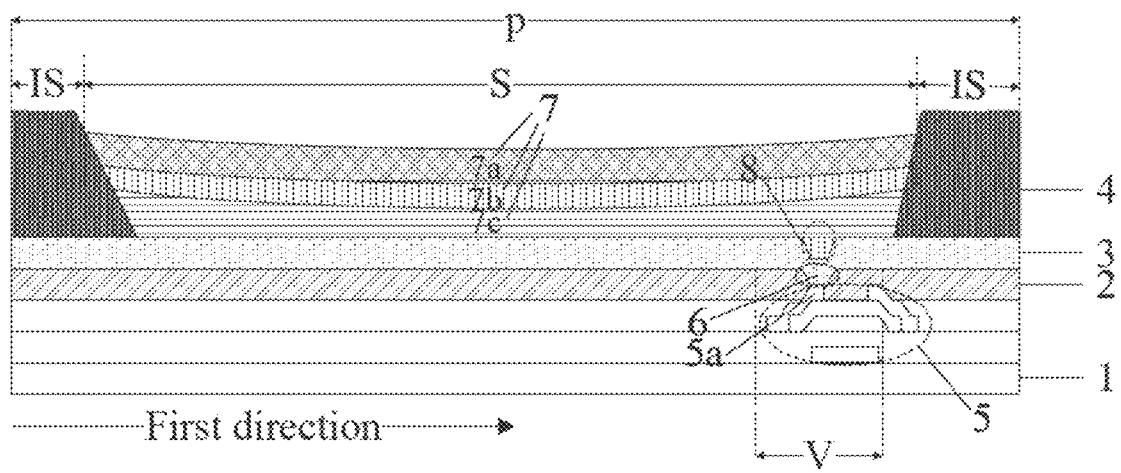
FIG. 5 is a cross-sectional view of an array substrate in some embodiments according to the present disclosure.

FIG. 5 is a cross-sectional view of an array substrate in some embodiments according to the present disclosure. Referring to FIG. 5, a portion of the pixel electrode layer 3 corresponding to the via 6 has a surface 8 distal to the base substrate 1. The surface 8 corresponding to the via 6 is concave relative to a surface of other portions of the pixel electrode layer 3 distal to the base substrate 1. In the present array substrate, the via 6 is in a region corresponding to an edge portion of the organic layer 7 (e.g., the organic light emitting layer 7b), which has a larger thickness as compared to the middle portion of the organic layer 7 (e.g., the organic light emitting layer 7b). Thus, the concaved surface 8 corresponding to the via 6 does not present an issue as the excess organic material in the region fills in the concave surface.

In another aspect, the present disclosure provides a method of fabricating an array substrate. In some embodiments, the method includes forming a thin film transistor on a base substrate, the thin film transistor being formed to comprises a drain electrode; forming a passivation layer on a side of the thin film transistor distal to the base substrate; forming a pixel electrode layer on a side of the passivation layer distal to the base substrate; forming a pixel definition layer on a side of the pixel electrode layer distal to the passivation layer and defining the subpixel region; forming an organic layer on a side of the pixel electrode layer distal to the passivation layer and forming a via extending through the passivation layer, the pixel electrode layer being formed to be electrically connected to the drain electrode of the thin film transistor through the via. The pixel definition layer defines a subpixel region of rite array substrate, and the organic layer is formed in the subpixel region. In the present method, the via is framed in the subpixel region. Optionally, the organic layer is formed by printing, e.g., ink-jet printing. The step of forming the organic layer includes forming an organic light emitting layer. Optionally, the step of forming the organic layer further includes forming one or more organic functional layers. Optionally, the organic light emitting layer is formed by printing, e.g., ink-jet printing. Optionally, the one or more organic functional layers are formed by printing, e.g., ink-jet printing.

In some embodiments, the step of forming the organic layer further includes forming one or more organic functional layers between the organic light emitting layer and the pixel electrode layer in the subpixel region. Optionally, the step of forming the one or more organic functional layer includes forming a carrier transport layer such as a hole transport layer. Optionally, the step of forming the one or more organic functional layer includes forming a earner injection layer such as a hole injection layer. Optionally, the step of forming the organic layer includes forming a hole injection layer on a side of the pixel electrode layer distal to the base substrate, forming a hole transport layer on a side of the hole injection layer distal to the pixel electrode layer, and forming an organic light emitting layer on a side of the hole transport layer distal to the hole injection layer. Optionally, the step of forming the organic layer includes forming a hole transport layer on a side of the pixel electrode layer distal to the base substrate, and forming an organic light emitting layer on a side of the hole transport layer distal to base substrate.

In some embodiments, the step of forming the organic layer further includes forming one or more organic functional layers on a side of the organic light emitting layer distal to the base substrate. Optionally, the step of forming the one or more organic functional layer includes forming a carrier transport layer such as an electron transport layer. Optionally, the step of forming the one or more organic functional layer includes forming a carrier injection layer such as an election injection layer. Optionally, the step of forming the organic layer includes forming an electron transport layer on a side of the organic light emitting layer distal to the pixel electrode layer, and forming an electron injection layer on a side of the electron transport layer distal to the organic light emitting layer. Optionally, the step of forming the organic layer includes forming a hole transport layer on a side of the pixel electrode layer distal to the base substrate, forming an organic light emitting layer on a side of the hole transport layer distal to base substrate, and forming an electron transport layer on a side of the organic light emitting layer distal to the hole transport layer.

Optionally, the step of forming the organic layer includes forming a hole injection layer on a side of the pixel electrode layer distal to the base substrate, forming a hole transport layer on a side of the hole injection layer distal to the pixel electrode layer, forming an organic light emitting layer on a side of the hole transport layer distal to the hole injection layer, forming an electron transport layer on a side of the organic light emitting layer distal to the hole transport layer, and forming an electron injection layer on a side of the electron transport layer distal to the organic light emitting layer.

In some embodiments, the array substrate (e.g., the pixel definition layer) is formed so that a projection of the via on the base substrate is substantially non-overlapping with that of any pixel definition layer in the array substrate.

In some embodiments, the array subs rate (e.g., the pixel definition layer and the organic layer) is formed so that a projection of the organic layer (e.g., the organic light emitting layer) on the base substrate substantially overlaps with that of the via. Optionally, the array substrate (e.g., the pixel definition layer and the organic layer) is framed so that a projection of the organic layer (e.g. the organic light emitting layer) on the base substrate substantially covers that of the via. In some embodiments, the array substrate (e.g., the pixel definition layer and the organic layer) is formed so that a projection of a light emitting region of the organic layer (e.g., a light emitting region of the organic light emitting layer) on the base substrate substantially overlaps with that of the via. Optionally, the array substrate (e.g., the pixel definition layer and the organic layer) is formed so that a projection of a light emitting region of the organic layer (e.g., a light emitting region of the organic light emitting layer) on the base substrate substantially covers that of the via.

In some embodiments, the array substrate (e.g., the pixel definition layer and the organic layer) is formed so that at least a portion of the thin film transistor is formed in the subpixel region. In one example, the array substrate (e.g., the pixel definition layer and the organic layer) is formed so that the drain electrode of the thin film transistor is formed in the subpixel region. In some embodiments, the array substrate (e.g., the pixel definition layer and the organic layer) is formed so that a projection of the drain electrode on the base substrate is substantially non-overlapping with that of any pixel definition layer in the array substrate.

In some embodiments, the array substrate (e.g., the pixel definition layer and the organic layer) is formed so that a projection of the organic layer (e.g., the organic light emitting layer) on the base substrate substantially overlaps with that of the drain electrode. Optionally, the array substrate (e.g., the pixel definition layer and the organic layer) is formed so that a projection of the organic layer (e.g., the organic light emitting layer) on the base substrate substantially covers that of the drain electrode. In some embodiments, the array substrate (e.g., the pixel definition layer and the organic layer) is formed so that a projection of a light emitting region of the organic layer (e.g., a light emitting region of the organic light emitting layer) on the base substrate substantially overlaps with that of the drain electrode. Optionally, the array substrate (e.g., the pixel definition layer and the organic layer) is formed so that a projection of a light emitting region of the organic layer (e.g., a light emitting region of the organic light emitting layer) on the base substrate substantially covers that of the drain electrode.

In some embodiments, the array substrate (e.g., the pixel definition layer and the organic layer) is formed so that the thin film transistor is entirely formed in the subpixel region. In some embodiments, the array substrate (e.g., the pixel definition layer and the organic layer) is formed so that a projection of the thin film transistor on the base substrate is substantially non-overlapping with that of any pixel definition layer in the array substrate.

In some embodiments, the array substrate (e.g., the pixel definition layer and the organic layer) is formed so that a projection of the organic layer (e.g., the organic light emitting layer) on the base substrate substantially overlaps with that of the thin film transistor. Optionally, the array substrate (e.g., the pixel definition layer and the organic layer) is formed so that a projection of the organic layer (e.g., the organic light emitting layer) on the base substrate substantially covers that of the thin film transistor. In some embodiments, the array substrate (e.g., the pixel definition layer and the organic layer) is formed so that a projection of a light emitting region of the organic layer (e.g., a light emitting region of the organic light emitting layer) on the base substrate substantially overlaps with that of the thin film transistor. Optionally, the array substrate (e.g., the pixel definition layer and the organic layer) is formed so that a projection of a light emitting region of the organic layer (e.g., a light emitting region of the organic light emitting layer) on the base substrate substantially covers that of the thin film transistor.

In some embodiments, the array substrate is formed to include a plurality of subpixel areas each of which is formed to have a shape elongated along a first direction. The plurality of subpixel areas are formed have a pitch p along the first direction. In some embodiments, a width of the subpixel region in each of the plurality of subpixel areas along the first direction is formed to be equal to (p−q); wherein p is the pitch of the plurality of subpixel areas along the first direction, and q is a value equal to or less than 35 μm. Optionally, q−35 μm. Optionally, q+μm Optionally, q−25 μm. Optionally, q−20 μm. Optionally, the width of the subpixel region in each of the plurality of subpixel areas along the first direction is formed to be approximately (p−17 μm).

In some embodiments, the array substrate is formed to include a plurality of subpixel areas each of which having a shape elongated along a first direction. Optionally, a width of the pixel definition layer between adjacent two subpixel regions respectively in adjacent two subpixel areas along the first direction is formed to be smaller than q, wherein q is a value equal to or less than 35 μm. Optionally, q=35 μm. Optionally, q=30 μm. Optionally, q=25 μm. Optionally, q=20 μm. In one example, the width of the pixel definition layer between adjacent two subpixel regions respectively in adjacent two subpixel areas along the first direction is formed to be approximately 17 μm.

In some embodiments, the array substrate is formed to include a plurality of subpixel areas each of which having a drape elongated along a first direction. The plurality of subpixel areas have a pitch along the first direction. In some embodiments, a width of the organic layer (e.g., the organic light emitting layer) in each of the plurality of subpixel areas along the first direction is formed to be equal to (p−q); wherein p is the pitch of the plurality of subpixel areas along the first direction, and q is a value equal to or less than 35 μm. Optionally, q=35 μm. Optionally, q=30 μm Optionally, q=25 μm. Optionally, q=20 μm. Optionally, the width of the organic layer (e.g., the organic light emitting layer) in each of the plurality of subpixel areas along the first direction is formed to be approximately (p−17 μm).

In some embodiments, a width of a light emitting region of the organic layer (e.g., the organic light emitting layer) in each of the plurality of subpixel areas along the first direction is formed to be equal to (p−q); wherein p is the pitch of the plurality of subpixel areas along the first direction, and q is a value equal to or less than 35 μm. Optionally, q−35 μm. Optionally, q−30 μm. Optionally, q=25 μm. Optionally, q=20 μm. Optionally, the width of the light emitting region of the organic layer (e.g., the organic light emitting layer) in each of the plurality of subpixel areas along file first direction is formed to be approximately (p−17 μm).

In some embodiments, a portion of the pixel electrode layer corresponding to the via has a surface distal to the base substrate; and the surface of the portion corresponding to the via is formed to be substantially level with a surface of other portions of the pixel electrode layer distal to the base substrate. Optionally, the method includes printing (e.g., ink-jet printing) a conductive paste (e.g., a silver paste) in the via. Optionally, the method further includes solidifying the conductive paste. Subsequently, the method further includes forming the pixel electrode layer on the passivation layer with the via pre-filled with the solidified conductive paste.

In some embodiments, a portion of the pixel electrode layer corresponding to the via has a surface distal to the base substrate; and the surface of the portion corresponding to the via is formed to be concave relative to a surface of other portions of the pixel electrode layer distal to the base substrate.

In another aspect, the present disclosure presides a display panel having an array substrate described herein or fabricated by a method described herein. The present display panel has a dramatically increased aperture ratio and an organic light emitting layer of substantially uniform thickness. Optionally, the aperture ratio of the present display panel increases at least by 9% as compared to the conventional array substrate.

In another aspect, the present disclosure provides a display apparatus having a display panel described herein. Examples of appropriate display apparatuses includes, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate having a subpixel region and an inter-subpixel region, comprising:
    a base substrate;
    a thin film transistor on the base substrate and comprising a drain electrode;
    a passivation layer on a side of the thin film transistor distal to the base substrate;
    a pixel electrode layer on a side of the passivation layer distal to the base substrate;
    a pixel definition layer in the inter-subpixel region on a side of the pixel electrode layer distal to the passivation layer and defining the subpixel region; and
    an organic layer comprising an organic light emitting layer in the subpixel region on a side of the pixel electrode layer distal to the passivation layer;
    wherein the array substrate comprises a via extending through the passivation layer;
    the pixel electrode layer is electrically connected to the drain electrode of the thin film transistor through the via;
    the organic layer has a non-uniform thickness, with a thickness in a peripheral part of the organic layer greater than a thickness in a central part of the organic layer;
    a projection of the peripheral part on the base substrate completely covers a projection of the via on the base substrate; and
    the projection of the via on the base substrate is completely non-overlapping with a projection of the pixel definition layer in the array substrate on the base substrate.

2. The array substrate of claim 1, wherein a projection of the drain electrode on the base substrate is completely non-overlapping with that of the pixel definition layer in the array substrate.

3. The array substrate of claim 1, wherein a projection of a light emitting region of the organic light emitting layer on the base substrate completely covers that of the thin film transistor.

4. The array substrate of claim 1, wherein a projection of a light emitting region of the organic light emitting layer on the base substrate substantially covers that of the via.

5. The array substrate of claim 1, wherein the drain electrode of the thin film transistor is in the subpixel region.

6. The array substrate of claim 5, wherein a projection of the drain electrode on the base substrate is substantially non-overlapping with that of any pixel definition layer in the array substrate.

7. The array substrate of claim 5, wherein a projection of the organic light emitting layer on the base substrate substantially covers that of the drain electrode.

8. The array substrate of claim 5, wherein a projection of a light emitting region of the organic light emitting layer on the base substrate substantially covers that of the drain electrode.

9. The array substrate of claim 5, wherein a projection of a light emitting region of the organic light emitting layer on the base substrate substantially covers that of the thin film transistor.

10. The array substrate of claim 1, comprising a plurality of subpixel areas each of which having a shape elongated along a first direction;
    wherein a width of the subpixel region in each of the plurality of subpixel areas along the first direction is greater than a pitch of the plurality of subpixel areas along the first direction minus 30 µm.

11. The array substrate of claim 10, wherein the width of the subpixel region in each of the plurality of subpixel areas along the first direction is approximately the pitch minus 17 µm.

12. The array substrate of claim 1, comprising a plurality of subpixel areas each of which having a shape elongated along a first direction;

wherein a width of the pixel definition layer between adjacent two subpixel regions respectively in adjacent two subpixel areas along the first direction is smaller than 30 µm.

13. The array substrate of claim 12, wherein the width of the pixel definition layer between adjacent two subpixel regions respectively in adjacent two subpixel areas along the first direction is approximately 17 µm.

14. The array substrate of claim 1, comprising a plurality of subpixel areas each of which having a shape elongated along a first direction;
wherein the plurality of subpixel areas have a pitch along the first direction; and
a width of the organic light emitting layer in each of the plurality of subpixel areas along the first direction is greater than the pitch minus 30 µm.

15. The array substrate of claim 14, wherein the width of the organic light emitting layer in each of the plurality of subpixel areas along the first direction is approximately the pitch minus 17 µm.

16. The array substrate of claim 1, wherein a first portion of the pixel electrode layer corresponding to the via has a first surface distal to the base substrate; and
the first surface is substantially level with a surface of other portions of the pixel electrode layer distal to the base substrate.

17. The array substrate of claim 16, comprising a solidified silver paste in the via.

18. The array substrate of claim 1, wherein the pixel electrode layer comprises a concaved portion and a convex portion
a maximum width of the convex portion in a cross-section along a cross-section plane intersecting the organic layer, the pixel electrode layer, the passivation layer, and the base substrate is greater than or equal to a maximum width of the concave portion in the cross-section plane;
the convex portion extends through the via to connect to the drain electrode; and
the peripheral part fills in the concave portion.

19. A display panel, comprising the array substrate of claim 1.

20. A method of fabricating an array substrate, comprising:
forming a thin film transistor on a base substrate, the thin film transistor being formed to comprises a drain electrode;
forming a passivation layer on a side of the thin film transistor distal to the base substrate;
forming a pixel electrode layer on a side of the passivation layer distal to the base substrate;
forming a pixel definition layer on a side of the pixel electrode layer distal to the passivation layer and defining a subpixel region;
forming an organic light emitting layer on a side of the pixel electrode layer distal to the passivation layer; and
forming a via extending through the passivation layer, the pixel electrode layer being formed to be electrically connected to the drain electrode of the thin film transistor through the via;
wherein the pixel definition layer defines a subpixel region of the array substrate;
the organic light emitting layer is formed in the subpixel region;
the organic light emitting layer is formed to have a non-uniform thickness, with a thickness in a peripheral part of the organic light emitting layer greater than a thickness in a central part of the organic light emitting layer;
a projection of the peripheral part on the base substrate completely covers a projection of the via on the base substrate; and
the projection of the via on the base substrate is completely non-overlapping with a projection of the pixel definition layer in the array substrate on the base substrate.

* * * * *